United States Patent
Wanka et al.

(10) Patent No.: US 7,850,819 B2
(45) Date of Patent: Dec. 14, 2010

(54) PLASMA REACTOR WITH HIGH PRODUCTIVITY

(75) Inventors: Harald Wanka, Blaustein (DE); Johann Georg Reichart, Blaubeuren (DE); Hans-Peter Voelk, Griesingen (DE)

(73) Assignee: Centrotherm Photovoltaics AG, Blaubeuren (DE)

( * ) Notice: Subject to any disclaimer, the term of this patent is extended or adjusted under 35 U.S.C. 154(b) by 1386 days.

(21) Appl. No.: 11/108,191

(22) Filed: Apr. 18, 2005

(65) Prior Publication Data

US 2005/0279456 A1    Dec. 22, 2005

(30) Foreign Application Priority Data

Apr. 16, 2004  (DE) .................. 10 2004 019 134
Apr. 27, 2004  (DE) .................. 10 2004 020 768

(51) Int. Cl.
  C23C 16/00  (2006.01)
  C23F 1/00   (2006.01)
  H01L 21/306 (2006.01)

(52) U.S. Cl. ............ 156/345.43; 156/916; 156/345.34; 156/345.38; 156/345.44; 156/345.47; 118/723 R; 118/723 E

(58) Field of Classification Search .......... 156/916, 156/345.43, 345.34, 345.38, 345.44, 345.47; 118/723 E, 723 R
See application file for complete search history.

(56) References Cited

U.S. PATENT DOCUMENTS 5,084,125 A  *  1/1992  Aoi .................. 156/345.31
5,292,419 A     3/1994  Moses et al.
5,951,772 A  *  9/1999  Matsuse et al. ......... 118/723 R
6,700,089 B1    3/2004  Hirooka
2003/0127433 A1  7/2003  Sirkis et al.
2007/0102291 A1  5/2007  Hartig

FOREIGN PATENT DOCUMENTS

EP    0492114 A1     7/1992
JP    60262969 A     12/1985
JP    2000-133827  *  5/2000
WO    2004101844 A1  11/2004

* cited by examiner

Primary Examiner—Michael Cleveland
Assistant Examiner—Keath T Chen
(74) Attorney, Agent, or Firm—Laurence A. Greenberg; Werner H. Stemer; Ralph E. Locher

(57) ABSTRACT

The invention relates to a plasma reactor with high productivity for surface coating or modification of objects and/or substrates by plasma processes in a processing chamber, preferably as vacuum processes at reduced pressure, having an entrance lock to the processing chamber and an exit lock. The invention is to create a plasma reactor of high productivity, which, with uniformly high productivity, will make possible a rapid simple and selective cleaning of the plasma sources and adjacent parts of the processing chamber. According to the invention, two plasma sources (1, 2) are provided, each alternately couplable to a reaction chamber (7) or a re-etching chamber (8). The plasma sources (1, 2) are fixed for this purpose to an alternating means (6) in such manner that the plasma sources (1, 2) are positionable by a rotatory motion of the alternating means (6) in the reaction chamber (7) or the re-etching chamber (8).

5 Claims, 1 Drawing Sheet

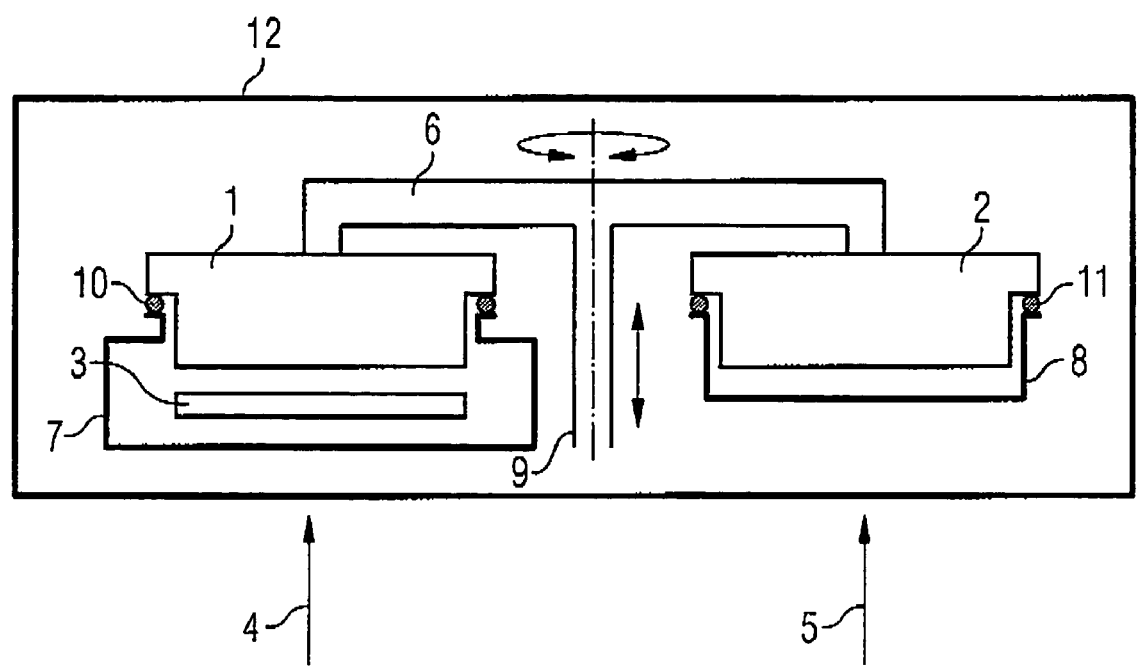

US 7,850,819 B2

PLASMA REACTOR WITH HIGH PRODUCTIVITY

CROSS REFERENCE TO RELATED APPLICATIONS

This application claims the benefit of German Patent Application No. 10 2004 019 134.4 filed Apr. 16, 2004 and German Patent Application No. 10 2004 020 768.2 filed Apr. 20, 2004, both of which applications are hereby incorporated by reference in their entireties herein.

FIELD OF THE INVENTION

The invention relates to a plasma reactor for surface coating or modification of objects or substrates by plasma processes. In particular, the invention relates to plasma reactors in which plasma processes are conducted in a processing chamber at reduced pressures, where the processing chamber is provided with entrance and exit locks.

BACKGROUND OF THE INVENTION

Plasma sources are employed in plasma processing chambers or reactors, for example, in semiconductor device fabrication technology, for coating wafers or other semiconductor structures and other substrates. The substrates or wafers are introduced into the processing chamber by way of the entrance lock. After substrate placement in the processing chamber, a reduced pressure suitable for the ensuing coating or processing operation is generated by a vacuum pump. After the desired reduced pressure is obtained, (e.g., 0.1 to 0.2 mbar) a plasma source (e.g., a magnetron or a capacitive electrode) is activated with a high-voltage high-frequency source. The magnetron or capacitive electrode introduces high-frequency energy into the processing chamber which is filled with a suitable processing gas.

By application of the high-frequency energy to the electrode, the processing gas is ionized in the processing chamber to generate a plasma. The substrate or material to be processed, which is located in the processing chamber (also designated as the receptacle), is exposed to the plasma. During the processing operation, fresh processing gas is added to the plasma reactor continuously, and at the same time contaminated or consumed gas is drawn off.

After processing of the substrate in the processing chamber is complete, the substrate is passed to the outside by way of an exit lock, in which at first the normal ambient pressure is established. The exit lock at the same time ensures that no processing gas can get into the environment.

It is well known that in coating operations in a processing chamber, for example a vacuum chamber, the inside walls of the chamber as well as the plasma source itself are always coated as well. These coatings, according to the prior art heretofore disclosed, cannot be prevented. The result is that the productivity of such a system is limited by the parasitic (undesirable) coatings on the plasma source or other components of the processing chamber. Upon reaching a pre-assigned boundary layer thickness, these deposits must be removed.

According to the past prior art, for example, as customary in the microelectronics industry, the processing chamber is cleaned by in situ etching (e.g. plasma etching) after the parasitic coatings on the plasma source and the other components, exceed a boundary layer thickness. Alternatively, the processing chamber may of course be aerated, opened and then cleaned mechanically. A disadvantage of both methods, of course, is that the productivity of the reactor reduced since no coating can be carried out during cleaning. Further, the interruption caused by the cleaning operations negatively affects the productivity of integrated production lines.

Other disadvantages of the mechanical cleaning or etching operations relate to the deleterious generation of particles in the processing chamber and health risks to personnel cleaning the processing chamber.

Consideration is now being given to ways of improving plasma processing systems and methods. In particular, attention is directed to improving plasma reactor structures and operations. Desirable plasma reactors may have uniformly high productivity, and permit rapid, simple and selective cleaning of the plasma sources and adjoining portions of the processing chamber.

SUMMARY OF THE INVENTION

A plasma reactor capable of uniformly high productivity is provided. The plasma reactor is configured so that a plasma source and adjoining portions of the processing chamber can be cleaned if necessary rapidly in a simple and selective manner without interrupting substrate processing flow.

The plasma reactor is provided with a pair of plasma sources and a pair of chamber, i.e. a processing reaction chamber and a re-etching or cleaning chamber. Each of the plasma sources can be alternately coupled to processing reaction chamber and the re-etching or cleaning chamber.

This arrangement of plasma sources provides redundancy so that at least one fully serviceable or operational plasma source is available at all times in the processing reaction chamber. As soon as the plasma source in processing reaction chamber has reached its target service time (i.e., maximum plasma hours), it may be quickly exchanged with a cleaned plasma source from the re-etching or cleaning chamber.

To accomplish this, the plasma sources, may be fixed on an alternating or reciprocating mechanism by which the plasma sources can be positioned in the reaction chamber or the re-etching chamber. The alternating mechanism may include rotational and/or translational motion drives.

In one version of the plasma reactor, the reaction chamber (processing chamber) and the re-etching chamber are stationary (e.g., in a vertical arrangement). In this version of the plasma reactor, the alternating mechanism may be configured to move the plasma sources between the two chambers (e.g., in a vertical direction).

In another version of the plasma reactor), provision may be the reaction chamber and the re-etching chamber themselves to be movable (e.g., vertically) relative to the plasma sources. In such case, the pair of plasma sources may be mounted on stationary support. The two chambers are mounted on the alternating mechanism.

In either version, the alternating mechanisms may be activated by suitable mechanical or electro-mechanical drives (e.g., a rotary drive or displacement drive). Further, to ensure a sufficiently gas tight environment, in both versions the reaction chamber and the re-etching chamber are configured so that they can be connected in a gas tight manner with respective plasma sources. Suitable seals may be used for this purposes.

In yet another version of the plasma reactor, the plasma sources are arranged in a common outer processing chamber or envelope together with the corresponding alternating means, the reaction chamber and the re-etching chamber. In this arrangement it is possible, when changing the position of the plasma sources, to retain a preadjusted (e.g., reduced) processing pressure, so that can be considerable saving of evacuation time.

BRIEF DESCRIPTION OF THE DRAWINGS

Further features of the invention, its nature, and various advantages will be more apparent from the following detailed description and the accompanying drawings, wherein like reference characters represent like elements throughout, and in which:

FIG. 1 is a schematic representation of an exemplary plasma reactor having as components a pair of plasma sources, a reaction chamber and a re-etching chambers arranged in an outer chamber. The components are arranged so that the plasma sources can be alternately position in either the reaction chamber or the re-etching chamber in accordance with the principles of the present invention.

The following is an index of the reference numerals used in FIG. 1:

LIST OF REFERENCE NUMERALS 1 plasma source
2 plasma source
3 substrate
4 processing position
5 re-etching position
6 alternating mechanism
7 reaction chamber/processing chamber
8 re-etching chamber
9 pick-up
10 seal
11 seal
12 processing chamber

DETAILED DESCRIPTION OF THE INVENTION

The present invention provides plasma reactors having a pair of plasma sources for plasma treatment or processing of substrates. The pair plasma sources is configured so that each plasma source can be alternately positioned in a processing reaction chamber or in an re-etching chamber. The plasma sources can be quickly switched from one chamber to the other with at most a minimal interruption in the processing flow or throughput of substrates in the plasma reactor.

With reference to FIG. 1, which shows an exemplary plasma reactor in accordance with the present invention, only one of plasma sources 1 and 2 is operational in the processing reaction chamber at any given time. The redundancy in plasma sources allows the plasma reactor to be operated continuously to coat substrates 3 without down time or significant interruptions for cleaning plasma sources, thereby achieving a maximum possible throughput.

The exemplary plasma reactor contains two plasma sources 1 and 2, each capable of being brought into an operating position 4 and a re-etching position 5. For this purpose, plasma sources 1 and 2 are fixed in such manner on an alternating mechanism 6 so that they can be brought alternately into the operating position 4 in a reaction chamber/processing chamber 7 and in the re-etching position 5 in a re-etching chamber 8. Alternating mechanism 6 is attached to a rotatable, and vertically liftable and lowerable pick-up 9, which is connected to a drive device (not shown). Alternatively, alternating mechanism 6 may be configured for displacement, in which configuration plasma sources 1 and 2 are fastened to corresponding linear guides. In this configuration plasma sources 1 and 2 can be placed in respective positions by a translation motion powered by a displacement drive.

In order to ensure a sufficient gas tightness in the respective positions, the processing chamber 7 and the re-etching chamber 8 are provided with seals 10 and 11, respectively. Seals 10 and 11 afford an adequate seal vis-à-vis plasma sources 1 or 2 positioned in the chambers 7 and 8.

After attaining the maximum possible plasma time in reaction processing chamber 7, the operational plasma source 1 (or 2) requires cleaning. To make this possible, plasma sources 1 and 2 may be employed in a sort of "revolving" sequence utilizing alternating mechanism 6. Thus, used plasma source 1 (or 2) can be transported out of the processing chamber 7 into re-etching chamber 8, and simultaneously a cleaned plasma source 2 (or 1) can be transported out of re-etching chamber 8 into reaction processing chamber 7. Then, in re-etching chamber 8, a plasma-chemical cleaning of the used plasma source 1 (or 2) may be carried out using a suitable ionized gas.

The provision of redundant plasma sources in the plasma reactor is advantageous as reaction chamber/processing chamber 7 can operate at full throughput almost uninterruptedly. Another advantage of the invention lies in that both the reaction chamber 7 and re-etching chamber/plasma cleaning chamber 8 can be optimally adapted to the specific plasma conditions at optimal cost.

In a version of the invention suitable for vacuum processing, plasma sources 1 and 2 disposed on corresponding alternating mechanism 6, reaction chamber 7 and re-etching chamber 8 all are disposed within a common outer processing chamber 12 (shown schematically in FIG. 1). With this arrangement, it may be possible to change the positions of plasma sources 1 and 2, retaining a pre-established pressure in chamber 12 and saving a considerable amount of chamber evacuation time.

Plasma sources 1 and 2 may be constructed with special shielding and extractions that will shield re-etching chamber 8 from the reaction chamber 7 itself, thus avoiding undesirable depositions in this place as well.

It will be understood that the foregoing is only illustrative of the principles of the invention, and that various modifications can be made by those skilled in the art without departing from the scope and spirit of the invention.

The invention claimed is:

1. A plasma reactor for plasma processing of substrates, the plasma reactor comprising:
   a substrate-processing reaction chamber having an operating position;
   a plasma source re-etching chamber having a re-etching position, the reaction chamber;
   a pair of equivalent/redundant plasma sources disposed on an alternating mechanism that moves the plasma sources relative to the chambers and is configured to alternately couple each plasma source to the substrate-processing reaction chamber in the operating position and to the plasma source re-etching chamber in the re-etching position so that the plasma source that is used in the substrate-processing reaction chamber is moved after use to for re-etching and the other plasma source is moved after re-etching in the plasma source re-etching chamber to the substrate-processing reaction chamber, the substrate processing chamber and the re-etching chamber each being provided with a respective gas-tight seal for sealing the chambers with the plasma sources in the operating position and the re-etching position; and an outer chamber having the reaction chamber, the re-etching chamber, and the plasma sources disposed therein.

2. The plasma reactor of claim 1 wherein the alternating mechanism is configured for rotational motion, translational motion, or a combination thereof.

3. The plasma reactor of claim 1 wherein the alternating mechanism is configured to transport the plasma sources relative to the reaction chamber and the re-etching chamber that are stationary.

4. The plasma reactor of claim 1 wherein the alternating mechanism is configured to transport the reaction chamber and the re-etching chamber relative to the plasma sources that are stationary.

5. The plasma reactor of claim 1 further comprising seals, whereby the reaction chamber and the re-etching chamber and the plasma sources can be connected in a gastight manner.

* * * * *

UNITED STATES PATENT AND TRADEMARK OFFICE
CERTIFICATE OF CORRECTION

PATENT NO. : 7,850,819 B2
APPLICATION NO. : 11/108191
DATED : December 14, 2010
INVENTOR(S) : Harald Wanka et al.

Page 1 of 1

It is certified that error appears in the above-identified patent and that said Letters Patent is hereby corrected as shown below:

Column 4,

Lines 51-52, "a plasma source re-etching chamber having a re-etching position, the reaction chamber" should read:

-- a plasma source re-etching chamber having a re-etching position --

Line 61, "use to for re-etching and the other plasma source is" should read:

-- use for re-etching and the other plasma source is --

Signed and Sealed this
Fifteenth Day of March, 2011

David J. Kappos
*Director of the United States Patent and Trademark Office*